United States Patent [19]

Grimaldi

[11] Patent Number: 4,573,172
[45] Date of Patent: Feb. 25, 1986

[54] PROGRAMMABLE CIRCUIT FOR SERIES-PARALLEL TRANSFORMATION OF A DIGITAL SIGNAL

[75] Inventor: Jean-Luc Grimaldi, Rennes, France
[73] Assignee: Thomson CSF, Paris, France
[21] Appl. No.: 623,560
[22] Filed: Jun. 22, 1984
[30] Foreign Application Priority Data Jun. 30, 1983 [FR] France .................. 83 10910

[51] Int. Cl.$^4$ ............................................. H04L 7/04
[52] U.S. Cl. ..................................... 375/116; 371/47; 375/120
[58] Field of Search ............... 375/108, 111, 114, 116, 375/119, 120; 370/106; 371/47

[56] References Cited

U.S. PATENT DOCUMENTS

| | | | |
|---|---|---|---|
| 3,641,274 | 2/1972 | Sasaki et al. | 375/114 |
| 3,936,762 | 2/1976 | Cox, Jr. | 375/120 |
| 4,214,124 | 7/1980 | Jarus | 375/114 |
| 4,242,755 | 12/1980 | Gauzan | 375/114 |
| 4,414,676 | 11/1983 | Kraul | 375/119 |
| 4,453,260 | 6/1984 | Inagawa et al. | 375/116 |

Primary Examiner—Marc E. Bookbinder
Attorney, Agent, or Firm—Cushman, Darby & Cushman

[57] ABSTRACT

A programmable circuit is provided for the series-parallel transformation of a digital signal and application thereof to a digital video signal receiver, comprising a circuit for detecting the synchronizing words in the series digital signal, a phase comparator generating pulses I and $\bar{I}$ characteristic of the coincidences and non coincidences between the parallel clock signal generated by a programmable divider from the series clock signal and pulses characteristic of the times when synchronizing words are detected; a logic circuit receives the pulses from the phase comparator and transfers them to the sync control input of a programmable divider when a predetermined programmable number of successive non coincidences or coincidences has been detected. This logic circuit also has a disconnecting control input. This circuit is implanted in a prediffused integrated network.

6 Claims, 2 Drawing Figures

PROGRAMMABLE CIRCUIT FOR SERIES-PARALLEL TRANSFORMATION OF A DIGITAL SIGNAL

BACKGROUND OF THE INVENTION

The invention relates to digital signal processing and provides more particularly a programmable circuit for series-parallel transformation of a digital signal.

Systems for transmitting digitalized video signals convert the analog video signal, at transmission, into a parallel train of eight bits by coding on 256 levels. These signals may be used as they are in a receiving station, but when these signals are to be transmitted, they are generally in the form of series digital trains. Transcoding devices provide this parallel-series conversion.

The associated receiving device comprises a synchronization retrieval circuit associated with a reverse series-parallel transcoding circuit, for restoring, from the series train, the succession of parallel binary words corresponding to the succession of levels of the video signal. The synchronization retrieval circuit recognizes the beginning of the coded words in the series digital train. For that, in the coded signal, synchronization sequences forming the digital frame are added to the information properly speaking and transmitted during synchronization periods, for example during the line sync pulses. These sequences are formed of synchronization words chosen so as not to be found in the series train of coded words. In the receiving device, these synchronization sequences are detected for synchronizing a "parallel" clock signal corresponding to the beginnings of the coded words in the series digital train.

During transmission, the transmission channel causes degradation of the signal which results in errors in the data received which affect similarly the information and the synchronization sequences. It is therefore necessary to provide a series-parallel transformation circuit which avoids loss of synchronization due to transmission errors.

BRIEF SUMMARY OF THE INVENTION

The invention provides then a modular series-parallel transformation circuit some of whose parameters are programmable and which therefore lends itself to a large number of synchronization strategies. This circuit avoids in particular loss of synchronization when the transmission error rate is not inconsiderable, by using a so called "hysteresis generator" logic circuit.

According to the invention, a circuit for the series-parallel transformation of a series digital signal into a succession of parallel binary words comprising an input shift register controlled by a series clock, and connected to a storage register controlled by a parallel clock, this series signal comprising sequences of synchronization words fixing its frame, comprises, in combination, a coincidence detector circuit having a first input which receives a reference synchronization word, a second input receiving the series digital signal and an output delivering coincidence pulses when the reference word is detected in the series digital signal, a phase comparator receiving on the one hand the coincidence pulses and on the other a phase reference signal, at the timing of the parallel words, from a divider whose demission rank is programmable depending on the number of parallel word bits, controlled by the clock associated ith the series digital train, this comparator delivering pulses I or Ī at two outputs depending on whether the coincidence pulses are in phase or not with the phase reference signal, and a hysteresis logic circuit connected to the outputs of said comparator transferring to its outputs validated pulses I or Ī when a given number of successive coincidence or non coincidence pulses are detected, the validated pulses being applied to the synchronisation control input of the programmable divider.

BRIEF DESCRIPTION OF THE DRAWINGS

The invention will be better understood and other features will appear from the following description with reference to the accompanying FIGS., in which.

DETAILED DESCRIPTION OF THE PREFERRED EMBODIMENT

Figure 1:
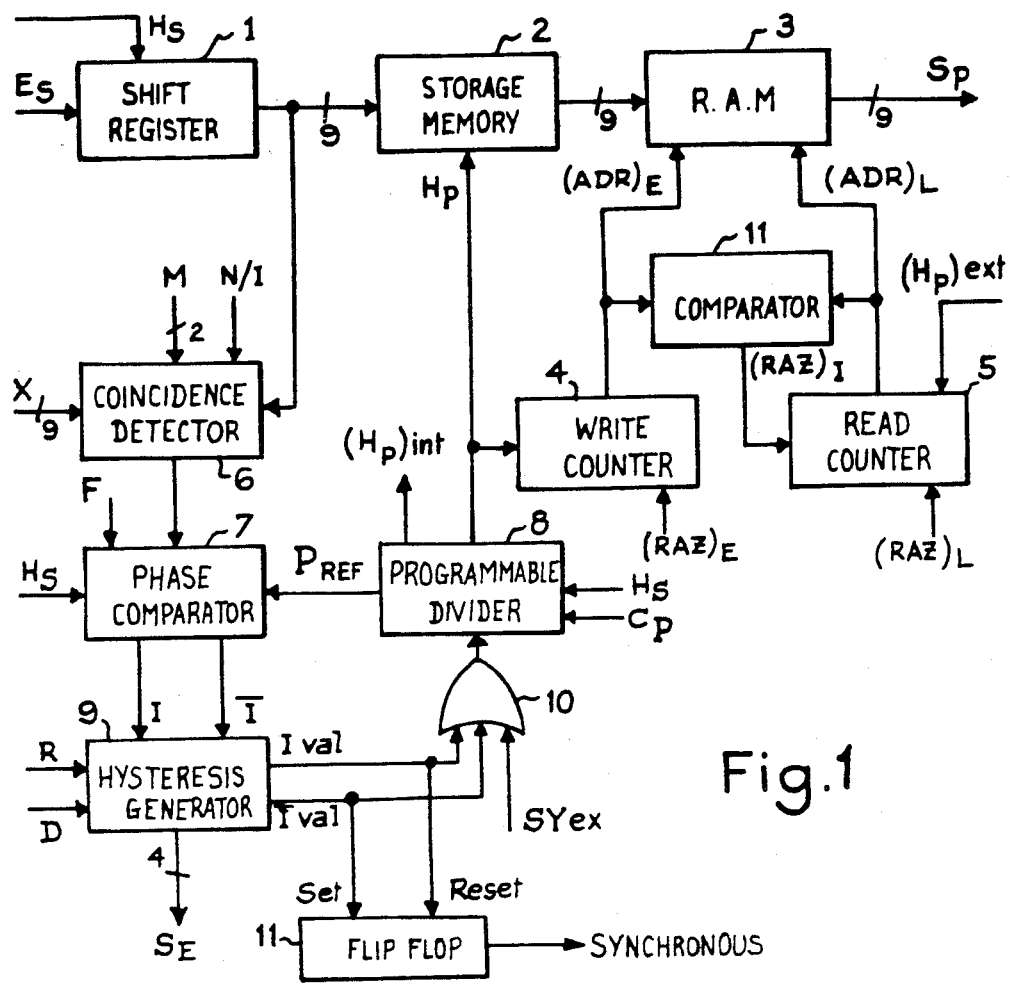
FIG. 1 is a block diagram of the programmable circuit of the invention for series-parallel transformation of a digital signal.

The following description with reference to FIG. 1 is given as an example of a digital signal transcoded in accordance with the transcoding process described in French patent application No. 80 25907, each parallel word of 8 bits giving rise to a sequence of series data of 9 bits, according to a particular code; a digital frame synchronization word X also comprising 9 bits and its complement to 1, $\overline{X}$, are transmitted alternately during the sync pulses and the video signal suppression intervals, for forming digital frame sync sequences.

The programmable circuit of the invention comprises a series input $E_S$ connected to the input of a 9 stage shift register 1; this register has a shift clock input receiving a clock signal $H_S$ at the frequency of the bits of the series train. The multiple output of this shift register, formed of 9 parallel outputs is connected to the corresponding multiple input of a storage register 2 which also has a clock input. The parallel outputs of this storage register are connected to the parallel inputs of a four stage 9 bit memory RAM 3. This memory RAM 3 is controlled by a writing address counter 4, whose address output $ADR_{(E)}$ is connected to the writing control input of the RAM 3. A reading address counter 5 controls the reading of RAM 3 by its address output $ADR_{(L)}$. The parallel data leave the RAM 3 to form the train of parallel bit $S_p$.

So as to obtain suitable synchronization of the transfer from the shift register 1 to the storage memory 2, then suitable reading of the RAM 3, the programmable circuit of the invention further comprises a word comparator coincidence detector 6 comprising a first multiple input connected to the multiple output of the shift regiter 1 and a second multiple input to which is applied one of the two complementary words X or $\overline{X}$ transmitted during the digital frame synchronizing sequence. This coincidence detector 6 further comprises two additional inputs: a masking input M for only taking certain stages of the coincidence detector into account when, for example, the parallel words to be transmitted only comprise a number of bits less than 9; finally an input N/I allowing an operator to control the comparison of the output word from the shift register applied to the first input of the detector either with the synchronization word X applied to its second input, or with its complement to 1, $\overline{X}$. This coincidence detector operates at the timing of the advance of shift register 1, that is to say at the timing of the series clock $H_S$. Under normal working conditions, inversion of the synchronization word, taken as reference, in the coincidence detector is operated whenever a coincidence is detected so as to take into account the composition of the synchronization sequences X $\overline{X}$ X $\overline{X}$ . . .

A pulse is sent to the output of the detector for each coincidence between a synchronizing word and the output word from the shift register. The output of this detector is connected to the input of a phase comparator 7 which compares the phase of the pulses generated by the coincidence detector with a phase reference signal $P_{REF}$, applied to a second input of a phase comparator, and coming from a divider 8 of the series clock signal $H_S$, the comparator further comprises an input F, called validation window, which only allows a comparison to be effected by comparator 7 when it is in a given state, for example state 0. When the reference phase of the divider and the pulse indicating the coincidence between the displayed synchronization word, or its complement, and the word at the output of the shift register, coincide, the phase comparator 7 delivers a pulse I at a first output. In the opposite case, the comparator delivers a pulse $\overline{I}$ at a second output. These pulses I and $\overline{I}$ are synchronous with the series clock $H_S$ applied to the clock input of a phase comparator. The outputs I and $\overline{I}$ of the phase comparator 7 are connected to two inputs of a circuit 9, called "logic hysteresis generator circuit", comprising mainly a four bit counter, whose purpose is to transmit only validated sync pulses I or $\overline{I}$. The operation of this circuit will be described in greater detail hereafter. It also comprises a so called "dynamic reduction" input R, a so called "counter disconnecting" input D, a four bit output $S_E$ indicating the state of the counter and two sync control outputs, one delivering the validated pulses I and the other delivering the validated pulses $\overline{I}$. The outputs are connected to two inputs of an OR gate 10 which receives at a third input an external sync signal $SY_{ex}$. The output of this OR gate is connected to a sync control input of divider 8. This divider, of the ring divider type, comprises a shift register relooped on itself, and has a clock input receiving the series clock signal $H_S$, a programming control input $C_p$ for determining the division rank of a series clock $H_S$ depending on the number of bits of the parallel words to be retrieved, namely 9 in the above mentioned example. But this input for controlling programming of the divider may allow division by 8 or 7 depending on the number of bits in the parallel words to be retrieved. A certain number of reference signals are provided by this programmable divider They differ from each other by their relative phase, and possibly by their cyclic ratio. This programmable divider supplies in particular the reference phase $P_{REF}$ applied to the phase comparator 7, the clock signal $H_p$ applied on the one hand to the clock input of the storage register 2 and on the other to the clock input of the writing counter 4. A parallel internal clock of the same phase and the same frequency a the parallel clock $H_p$ but having a cyclic ration of 50% is also generated.

Finally, the transformation circuit also comprises a flip flop 11 whose set and reset inputs are connected to the outputs of the hysteresis generator circuit. The logic "synchronous" output signal from this flip flop indicates, in a first state, that the parallel clock and the digital signal are synchronous and in the other state that synchronization has not been acquired.

The purpose of the logic hysteresis generator circuit is to avoid loss of synchronization of the system due to transmission errors generating detecton of the synchronization word whereas this word has not been transmitted. The four bit counter is, in the start up phase, in an intermediate state 1000 (8 in decimals) and is incremented on reception of pulses I and decremented on reception of pulses $\overline{I}$. In the count up mode, when the counter has reached the state defined as being the maximum state, it can no longer be incremented. In the down counting mode, when it reaches a state defined as being the minimum state, it returns to the intermediate state if a new pulse $\overline{I}$ is received. Considering the capacity of the counter, it is possible to determine the maximum and minimum state in several ways, either 4 and 12 for the minimum and the maximum, or 0 to 15. These pairs of extreme states define the dynamics of the logic circuit, and so the hysteresis, and are chosen by the user by means of the dynamic reduction input R.

When the counter reaches the maximum state, it remains in this state and all the pulses I received by the corresponding input are then validated and transmitted to the sync input of the programmable divider, these pulses confirming that synchronization is acquired. On the other hand, when the counter reaches the minimum state, the next pulse $\overline{I}$ is transferred to the sync input of the programmable divider and controls a shift, the counter then being brought back to the intermediate state 1000, as mentioned above.

The dynamics mentioned above as being either between 4 and 12 or between 0 and 15, determines then the number of non coincidences required for controlling resynchronization. In fact, should a transmission error occur the synchronization word may be detected in the series binary signal without it having been actually transmitted. The coincidence detector then supplies a pulse which gives rise to a pulse I or $\overline{I}$ for validating or non validating the synchronization which corresponds to nothing; the hysteresis generator circuit takes these pulses into account only after several successive coincidences or non coincidences.

However, for particular applications, it may be advantageous to transfer to the programmable divider all the pulses coming from the phase comparator. For that, the disconnecting input D of the logic hysteresis generating circuit allows this circuit to be made transparent, all the pulses received at its input being transferred to its output. The state of the counter then remains at the intermediate value.

The state of the counter is accessible, a direct output of the counter $S_E$ giving the state of the counter, over four bits.

Divider 8 delivers then the parallel clock signal $H_p$, applied to the clock input of the storage register 2, and the phase reference signal $P_{REF}$ which is derived therefrom, phase shifted or sustained, its transitions being fixed by the output signal of the OR gate 10, that is to say by the pulse I or $\overline{I}$, or by an external sync signal $SY_{ext}$.

Finally, so that the modular circuit may be integrated without difficulty in an assembly driven by a different clock signal, that is to say by an eternal clock $(H_p)_{xt}$ of the same timing as $H_p$ but possibly phase shifted, the memory RAM 3 plays the role of buffer memory. This memory also allows a phase jig between $H_p$ and $(H_p)_{ext}$ to be accomodated.

For that, the writing address counter 4 is incremented at the timing of clock $H_p$ and the reading address counter is incremented at the timing of the external clock signal $(H_p)_{ext}$. The nine bit words are written consecutively in the four registers of memory 4 by decoding their addresses given by the state of the writing counter 4. The homologous output of the four registers are multiplexed, and selected by the address of the reading counter 5. The states of these two counters 4 and 5 are compared in a comparator 11. Thus, if at a given moment the two counters are in the same state, the reading counter is reset so as to avoid any possibility of writing-reading conflict. These two counters also have reset inputs for external action by an operator.

In the case where the series-parallel transformation is to be carried out on words of less than 9 bits, it is sufficient to ignore some of the stages of the registers forming the RAM 4.

The above described circuit is particularly well adapted, because of the number of function required, to construction in integrated form in a prediffused network integrated circuit comprising 60 sites for example.

It also provides series-parallel transformation of bits of 9 words or less, for example 8 or 7 and may operate at a maximum speed of 250 M bits/s, which is well adapted to the series-parallel transformation of a digitized video signal at a series bit rate of 243 M b/s (27 M bits/s×9) into a signal organized finally, that is to say after transcoding from 9 to 8 bits, in words of 8 parallel bits at the rate of 27 M bytes/s.

Figure 2:
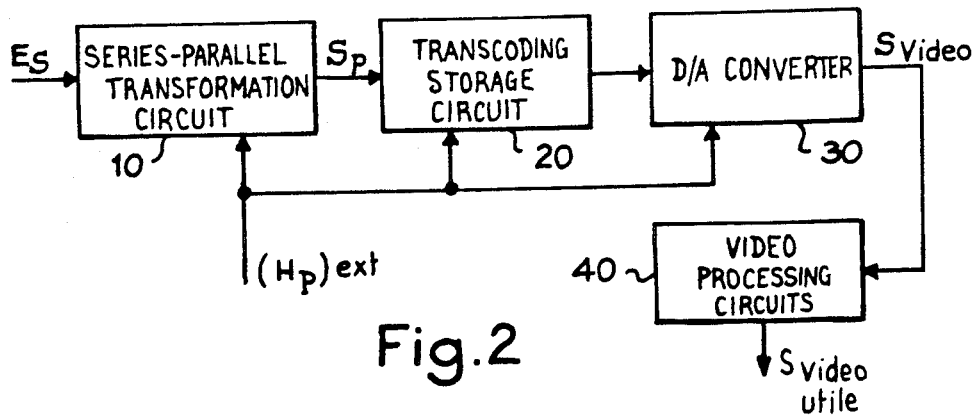
FIG. 2 is a general diagram of a digitalized 15 and serialized video signal receiver.

FIG. 2 shows a general diagram of a receiver circuit using such a series-parallel transformation circuit. The series input $E_S$ receives the series digitized signal, for example at the rate of 243 M b/s, from the transmission channel. The series-parallel transformation circuit 10 decribed with reference to FIG. 1 delivers a signal containing the same data transformed into a train of words of 9 parallel bits $S_p$. This digital train $S_p$ is applied to a transcoding storage circuit 20 which converts the 9 bit words transmitted into words of 8 bits directly related to the levels of the video signal. The output of the transcoding circuit 20 is connected to the input of a digital-analog converter 30 which restores the video signal in its analog form. The video processing circuits 40 may be provided for then delivering the useful video signal.

The invention is not limited to the embodiment described and represented. In particular, transcoding processes exist in which the 8 bit words conventionally coming from the analog-digital converter, at transmission, are transformed into 10 bit words transmitted in series form. In this case, an analog series-parallel transformation circuit could be formed. However, construction in the form of a prediffused network integrated circuit is difficult because the serie bit rate 10×7=270 M bits/s is greater than the maximum rate mentioned above.

This circuit is particularly applicable to series transmission in the field of professional digital television, in the field of digital video tape recorders for deserializing recorded data, or even in the telecommunications field for transmitting series data to be serialized on reception.

What is claimed is:

1. a circuit for the series-parallel transformation of a series digital signal having sequences of synchronization words determining a frame thereof into a sequence of parallel binary words comprising: an input shift register controlled by a series clock said shift register being connected to a storage register controlled by a parallel clock, a coincidence detector circuit having a first input which receives a reference synchronization word, a second input receiving the series digital signal from an output of said shift register and an output delivering coincidence pulses when the reference word is detected in the series digital signal, a phase comparator receiving, on a first input thereof the coincidence pulses and, on a second input thereof, a phase reference signal, at a timing rate of the parallel words, a divider whose divisor is programmable to a value related to the number of parallel word bits, controlled by said series clock for supplying said phase reference signal, said phase comparator delivering pulses I or $\bar{I}$ at two outputs thereof depending on whether the coincidence pulses are in phase or out of phase with the phase reference signal, and a logic hysteresis circuit connected to the outputs of said phase comparator and having two outputs upon which are supplied respective validated pulses Ival or $\bar{I}$val when a predetermined number of successive pulses I or $\bar{I}$ respectively, are detected, the validated pulses being applied to a sync control input of the programmable divider.

2. The circuit as claimed in claim 1, wherein a synchronizing sequence includes successions of complementary words, X and $\bar{X}$ one of these words being said reference synchronization word, the coincidence detector circuit comprising means for inverting the reference word after each coincidence detection.

3. The circuit as claimed in claim 1, wherein said logic hysteresis circuit has a control input determining the number of successive pulses required for validating pulses I or $\bar{I}$.

4. The circuit as claimed in claim 1, wherein an output storage circuit is connected to the output of the storage register in which the writing of parallel words is controlled by the parallel clock and the reading out and application of these same words to user circuits is controlled by an external parallel clock of the same timing as the parallel clock 5. The circuit as claimed in claim 4, wherein, said programmable divider supplies said parallel clock control and the circuit further comprises a flip flop whose two inputs are connected to the outputs of the logic hysteresis circuit and whose output indicates, depending on its state, whether the parallel clock is synchronous or not with the frame of the series digital, signal, the logic hysteresis circuit including a counter which has a further output providing a count status signal.

6. The circuit as claimed in claim 5, in the form of a prediffused network integrated circuit, for the transmission of a series signal having a rate less than 250 MBits/s.

* * * * *